US007006939B2

(12) United States Patent
Voorakaranam et al.

(10) Patent No.: US 7,006,939 B2
(45) Date of Patent: Feb. 28, 2006

(54) METHOD AND APPARATUS FOR LOW COST SIGNATURE TESTING FOR ANALOG AND RF CIRCUITS

(75) Inventors: Ram Voorakaranam, Smyrna, GA (US); Abhijit Chatterjee, Marietta, GA (US); Pramodchandran N. Variyam, Plano, TX (US); Sasikumar Cherubal, Atlanta, GA (US); Alfred V. Gomes, Sunnyvale, CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 777 days.

(21) Appl. No.: 09/837,887

(22) Filed: Apr. 18, 2001

(65) Prior Publication Data

US 2002/0133772 A1 Sep. 19, 2002

Related U.S. Application Data

(63) Continuation-in-part of application No. 09/575,488, filed on May 19, 2000, now Pat. No. 6,865,500.
(60) Provisional application No. 60/197,749, filed on Apr. 19, 2000, and provisional application No. 60/203,206, filed on May 12, 2000.

(51) Int. Cl.
*G06F 11/263* (2006.01)

(52) U.S. Cl. .................... 702/117; 702/118; 703/13; 703/14; 714/738; 714/741

(58) Field of Classification Search ................ 702/185, 702/117–121, 123, 124, 126, 58, 59, 189, 702/112, 81–84, 181–183; 714/25, 30, 32, 714/33, 37, 724, 727, 728, 736, 732, 738, 714/740, 718, 741, 723; 324/500, 512, 765, 324/73.1, 602, 600; 365/201; 438/14, 17, 438/18; 716/1, 2, 4; 703/13, 14; 700/108, 700/109, 121

See application file for complete search history.

(56) References Cited

U.S. PATENT DOCUMENTS

| 4,991,176 | A | * | 2/1991 | Dahbura et al. ............ 714/738 |
| 5,341,315 | A | * | 8/1994 | Niwa et al. ................. 714/738 |
| 6,114,858 | A | | 9/2000 | Kasten ....................... 324/616 |
| 6,625,785 | B1 | * | 9/2003 | Chatterjee et al. ............. 716/4 |

OTHER PUBLICATIONS

Balivada et al., "Analog Testing with Time Response Parameters", 1996, IEEE Design & Test of Computers, pp. 18–25.*

Voorakaranam et al., "Low–Cost Signature Testing of RF Circuits", no date on reference, pp. 2–11.*

S. J. Tsai, "Test Vector Generation for Linear Analog Devices," International Test Conference (1991) 592–597, (No Month).

W. Lindermeir, H.E. Graeb & K.J. Antreich, "Design of Robust Test Criteria in Analog Testing," International Conference on Computer–Aided Design (1995) 604–611, (No Month).

R. Voorakaranam & A. Chatterjee, "Test Generation for Accurate Prediction of Analog Specifications," IEEE VLSI Test Symposium (2000) 137–142, (No Month).

(Continued)

*Primary Examiner*—Hal Wachsman
(74) *Attorney, Agent, or Firm*—Birdwell & Janke, LLP

(57) ABSTRACT

A low cost signature test for RF and analog circuits. A model is provided to predict one or more performance parameters characterizing a first electronic circuit produced by a manufacturing process subject to process variation from the output of one or more second electronic circuits produced by the same process in response to a selected test stimulus, and iteratively varying the test stimulus to minimize the error between the predicted performance parameters and corresponding measured values for the performance parameters, for determining an optimized test stimulus. A non-linear model is preferably constructed for relating signature test results employing the optimized test stimulus in manufacturing testing to circuit performance parameters.

17 Claims, 4 Drawing Sheets

OTHER PUBLICATIONS

J.H. Friedman, "Multivariate Adaptive Regression Splines," The Annals of Statistics, vol. 19, No. 1, 1–14L (No Date).

P.A. Variyam and A. Chatterjee, "Specification–Driven Test Design for Analog Circuits," International Symposium on Defect and Fault Tolerance in VLSI Systems (1998) 335–340, (No Month).

T. Wilson, "Test Challenges for Next–Generation RF Devices," EE Evaluation Engineering, vol. 39, No. 11 (2000) 31–37, (No Month).

D.A. Coley, An Introduction to Genetic Algorithms for Scientists and Engineers, World Scinetific (1996) 1–16, (No Month).

Cadence SpectreRF Simulator User Guide (Dec. 1999), 16 pages.

Cadence OCEAN Reference Guide (Dec. 1999), 17 pages.

RF Micro–Devices, Low Noise Amplifier/Mixer (Mar. 2001), 6 pages.

S. Cherubal & A. Chatterjee, "Parametric Fault Diagnosis for Analog Systems Using Functional Mapping," Proceedings, Design, Automation and Test in Europe (1999) 195–200, (No Month).

P.N. Variyam & A. Chatterjee, "Enhancing Test Effectiveness for Analog Circuits Using Synthesized Measurements," VLSI Test Symposium (1998) 132–137, (No Month).

A. Walker, W. Alexander & P.K. Lala, "Fault Diagnosis in Analog Circuits Using Element Modulation," IEEE Design and Test of Computers (Mar. 1992) 19–29.

H. Walker & S.W. Director, "VLASIC: A Catastrophic Fault Yield Simulator for Integrated Circuits," IEEE Transactions on Computer–Aided Design (Oct. 1986) 541–556.

N.Nagi, A. Chatterjee, A. Balivada & J.A. Abraham, "Fault–Based Automatic Test Generation for Linear Analogy Devices," Proceedings, International Conference on Computer–Aided Design (1993) 89–91, (No Month).

M. Salamani & B. Kaminska, "Multifrequency Analysis of Faults in Analog Circuits," IEEE Design and Test of Computers (1995) 70–80, (No Month).

B. Hamida, K. Saab, D. Marche, B. Kaminska & G. Qusnel, "LIMSoft: Automated Tool for Design and Test Integration of Analog Circuits," International Test Conference (1996) 571–580, (No Month).

H.H. Zheng, A. Balivada & J.A. Abraham, "A Novel Test Generation Approach for Parametric Faults in Linear Analog Circuits," VLSI Test Symposium (1996) 470–475, (No Month).

A. Abderrahman, E. Cerny & B. Kaminska, "CLP–Based Multifrequency Test Generation for Analog Circuits," VLSI Test Symposium (1997) 158–165, (No Month).

G. Devarayanadurg & M. Soma, "Dynamic Test Signal Design for Analog ICs," Proceedings, International Conference on Computer–Aided Design (1995) 627–629, (no month).

W. Verhaegen, G. Van de Plas & G. Gielen, "Automated Test Pattern Generation for Analog ICs," Proceedings, VLSI Test Symposium (1997) 296–301, (no month).

J.B. Brockman & S.W. Director, "Predictive Subset Testing: Optimizing IC Parametric Performance Testing for Quality, Cost and Yield," IEEE Transactions on Semiconductor Manufacturing, vol. 2 (1989) 104–113, (no month).

W. Maly & Z. Pizlo, "Tolerance Assignment for IC Selection Tests," IEEE Transactions on Computer–Aided Design (Apr. 1985) 156–162.

T.M. Souders & G.N. Stenbakken, "Cutting the High Cost of Testing," IEEE Spectrum (Mar. 1991) 48–51.

S.D. Huss & R.S. Gyurcsik, "Optimal Ordering of Analog IC Tests to Minimize Time," Proceedings, Design Automation Conference (1991) 494–499, (no month).

L. Milor & A.L. Sangiovanni–Vincentelli, "Minimizing Production Test Time to Detect Faults in Analog Circuits," IEEE Transactions on Computer–Aided Design, vol. 13 (1994) 796–813, (no month).

M.J. Marlett & J.A. Abraham, "DC–JATP: An Iterative Analog Circuit Test Generation Program for Generating DC Single Pattern Tests," Proceedings, IEEE International Test Conference (1988) 839–845, (no month).

G. Devarayanadurg & M. Soma, "Analytic Fault Modeling and Static Test Generation for Analog ICs," International Conference for Computer–Aided Design (1994) 44–47, (no month).

W.M. Lindermeir, H.E. Graeb & K.J. Antreich, "Design Based Analog Testing by Characteristic Observation Inference," International Conference for Computer–Aided Design (1995) 620–626, (no month).

C.Y. Pan & K.T. Cheng, "Implicit Functional Testing for Analog Circuits," VLSI Test Symposium (1996) 489–494, (no month).

P.N. Variyam & A. Chatterjee, "Test Generation for Comprehensive Testing of Linear Analog Circuits Using Transient Response Sampling", International Conference on Computer–Aided Design (1997) 382–385, (no month).

K.J. Antreich, H.E. Graeb & C.U. Wieser, "Circuit Analysis and Optimization Driven by Worst Case Distances," IEEE Transaction on CAD, vol. 13 (1994) 57–71, (no month).

D.G. Saab, Y.G. Saab & J.A. Abraham, "CRIS: A Test Cultivation Program for Sequential VLSI Circuits," Proceedings: International Conference on Computer–Aided Design (1992) 216–219, (no month).

G. Devarayanadurg, P. Goteti & M. Soma, "Hierarchy Based Statistical Fault Simulation of Mixed–Signal ICs," International Test Conference (1996) 521–527, (nno month).

A. Basilevsky, "Statistical Factor Analysis and Related Methods, Theory and Applications," Wiley Series in Probability and Mathematics (1994), 44 pages, (no month).

I.T. Joliffe, "Discarding Variables in a Principle Component Analysis, I. Artificial Data," Applied Statistics, vol. 22 (1973) 21–31, (No Month).

L. Milor & A. L. Sangiovanni–Vincentelli, "Optimal Test Set Design for Analog Circuits," International Conference on Computer–Aided Design (1990) 294–297, (No Month).

A.V. Gomes & A. Chatterjee, "Minimal Length Diagnostic Tests for Analog Circuits Using Test History," Design, Automation and Test in Europe (1999) 189–194, (No Month).

MATLAB Optimization Toolbox User's Guide, 4 pages, (No Date).

* cited by examiner

METHOD AND APPARATUS FOR LOW COST SIGNATURE TESTING FOR ANALOG AND RF CIRCUITS

This application is a continuation-in-part of the inventors' prior application Ser. No. 09/575,488, filed May 19, 2000, entitled Method for Testing Circuits, now U.S. Pat. No 6,865,500, issued Mar. 8, 2005, and claims the benefit of the provisional application Ser. No. 60/197,749, filed Apr. 19, 2000, entitled ATPG for Prediction of Analog Specifications, and Ser. No. 60/203,602, filed May 12, 2000, entitled Test Generation for High Frequency and RF Circuits, each incorporated by reference in their entireties herein.

BACKGROUND OF THE INVENTION

The present invention relates to a method and apparatus for low cost signature testing for testing analog and RF circuits. More particularly, the invention relates to such a method and apparatus for use in manufacturing testing, and for use in monitoring the manufacturing process.

Analog and RF circuits are characterized by a set of performance parameters that typically vary continuously over a range. These performance parameters result from design as modified by variations in the manufacturing process that occur over time. Because of this variation, it is often necessary to test at least some of the circuits produced by a given manufacturing process to ensure that the performance parameters of the circuits fall within given specification limits.

However, traditional testing methods impose an increasing burden in the form of test time as a result of the ever increasing complexity and speeds of analog and RF circuits. For example, straightforward testing employs automated or automatic test equipment ("ATE") to stimulate the circuit under test (CUT) in a manner designed to induce the circuit to provide an output which directly reflects the value of each performance parameter which it is desired to test. The output is used to determine whether the parameter is within specification limits, in which case the CUT is considered "good" or is considered to "pass," or whether the parameter is outside the specification limits, wherein the CUT is considered "bad" or is considered to "fail." Each performance parameter requires, in general, a specific stimulus appropriate for testing that parameter and a corresponding output measurement, and it is therefore time consuming to step through all of the required test stimuli to obtain the performance parameters of interest in this manner.

Various techniques have been proposed to minimize this test time and, therefore, the cost of testing. Such techniques have attempted to arrive at a single test stimulus effective for discerning whether the CUT passes or fails. For example, S. J. Tsai, "Test vector generation for linear analog devices," International Test Conference, pp. 592–597, 1991, characterizes the circuit as either "good" or "bad" as a result of its response to a stimulus that maximizes the difference in response between circuits having these characterizations. The stimulus is obtained by optimization methods, wherein the impulse responses for good and bad circuits are used as input to an optimization model, the result of which produces the test stimulus.

Alternatively, as in W. Lindermeir, H. E. Graeb and K. J. Antreich, "Design of Robust Test Criteria in Analog Testing," International Conference on Computer Aided Design, pp. 604–611, 1995, a user provides a set of proposed test stimuli, and the method provides for choosing the one that is most effective at discriminating between "good" and "bad" circuits.

Some serious drawbacks of these methods are that neither is applicable to non-linear circuits, and neither provides quantitative information about the circuit performance parameters themselves. Further the method of the latter reference places a demand on the user to provide a set of test stimuli, hence the method provides no assistance in generating or optimizing the test stimuli.

Moreover, an additional problem encountered in testing RF circuits is the need for very high frequencies in the test signal. This imposes an additional cost on testing, as the ATE needed to produce high frequency test signals of arbitrary shape is more complex and difficult to use. Neither of the aforementioned prior art test methodologies has addressed this problem.

Accordingly, there is a need for a method and apparatus for low cost signature testing of both RF and analog circuits that provides more information about circuit performance parameters and provides more information about the manufacturing process.

SUMMARY OF THE INVENTION

The method and apparatus for low cost signature testing for analog and RF circuits according to the present invention solves the aforementioned problems and meets the aforementioned needs by providing a model adapted to predict one or more performance parameters characterizing a first electronic circuit produced by a manufacturing process subject to process variation from the output of one or more second electronic circuits produced by the same process in response to a selected test stimulus, and iteratively varying the test stimulus to minimize the error between the predicted performance parameters and corresponding measured values for the performance parameters, for determining an optimized test stimulus.

The optimized test stimulus is applied to manufactured circuits under test for testing the quality of the circuits, and output signatures are obtained. The output signatures thereby obtained are preferably applied to a non-linear model to obtain more accurately predicted performance parameters for the manufactured circuits.

Therefore, it is a principal object of the present invention to provide a novel and improved method and apparatus for low cost signature testing for analog and RF circuits.

It is another object of the invention to provide such a novel and improved method and apparatus for low cost signature testing for analog and RF circuits that efficiently reduces test time and therefore cost.

It is yet another object of the invention to provide such a novel and improved method and apparatus that provides for maximizing prediction accuracy.

It is still another object of the present invention to provide such a method and apparatus for low cost signature testing for analog and RF circuits that provides more information about circuit performance parameters than would otherwise be available.

It is a further object of the present invention to provide such a method and apparatus for low cost signature testing for analog and RF circuits that provides for calibrating for short or long term variations in the manufacturing process.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENT

The present application incorporates herein by reference that portion of the U.S. provisional application Ser. No. 60/197,749, entitled "Test Generation for Accurate Prediction of Analog Specifications," which provides mathematical explanation, background and support for methods according to the invention that are described herein in a simplified manner. Also incorporated herein is the inventor's paper, submitted to the International Test Conference 2001, entitled "Low-Cost Signature Testing of RF Circuits," attached hereto as Appendix A.

Figure 1A:
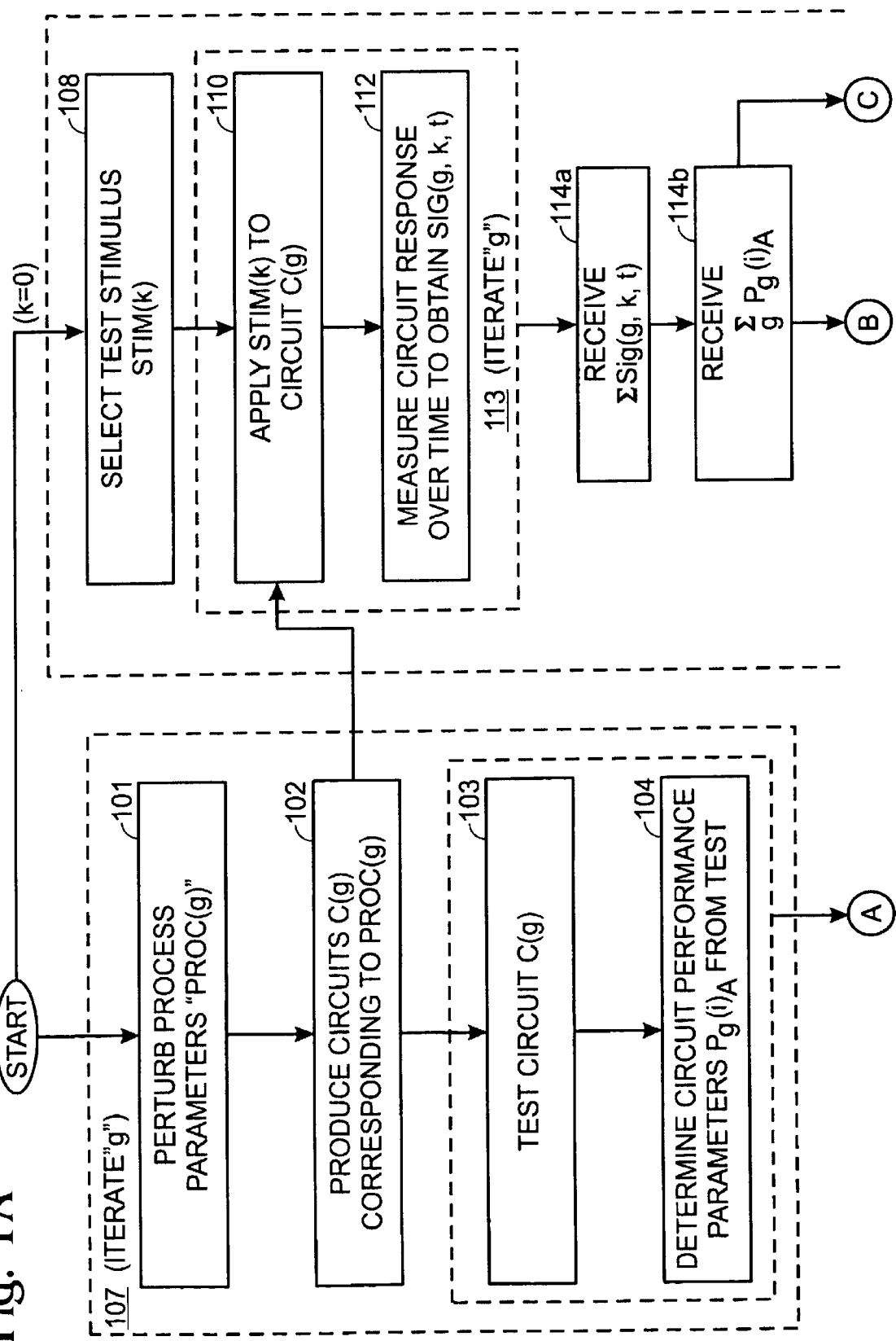
FIG. 1 is a flow chart of a preferred method for developing an optimized test signal as part of a method for low cost signature testing of electronic circuits according to the present invention.
Figure 1B:
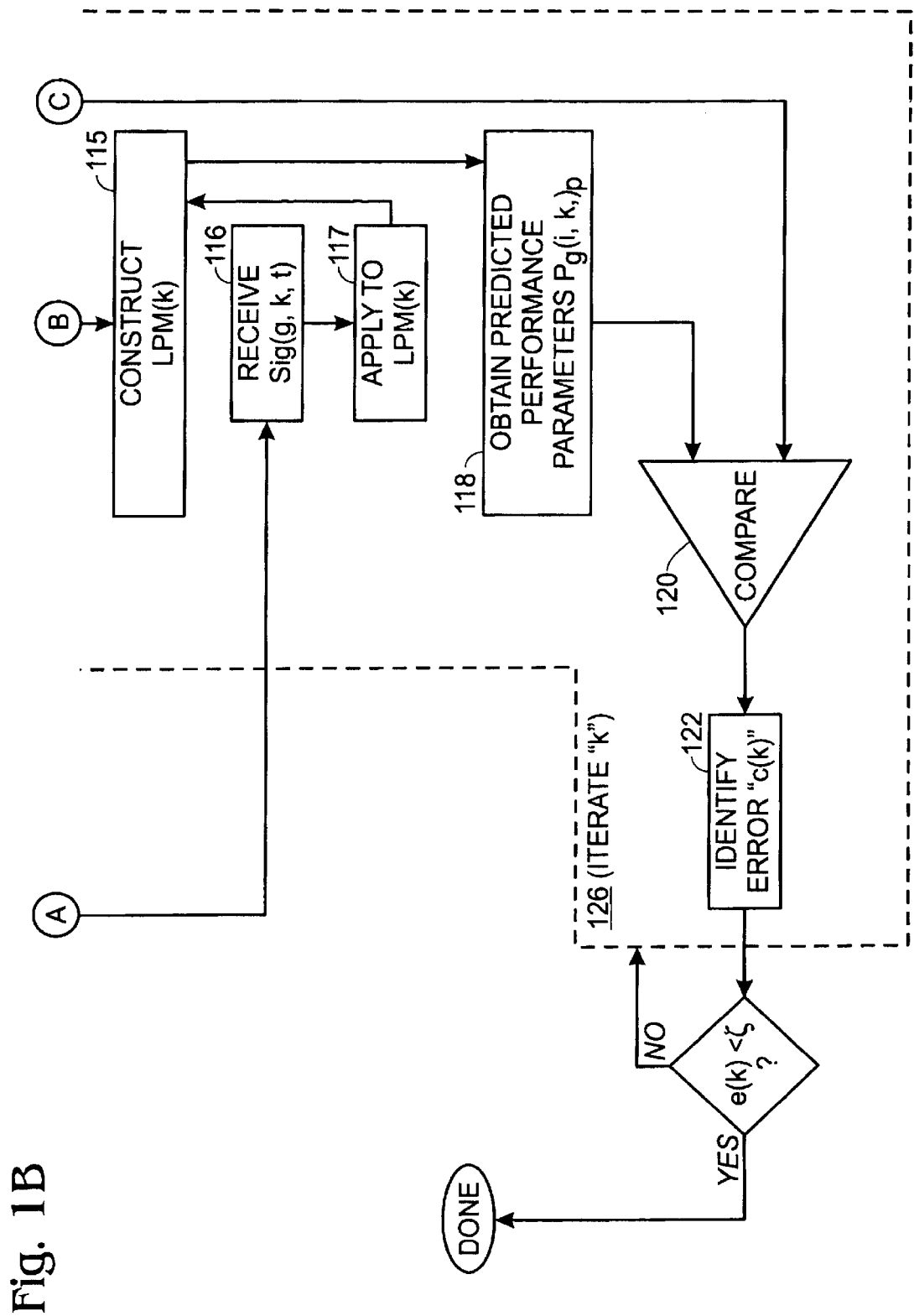

With reference to FIG. 1, a flow chart of a preferred method for low cost signature testing 100 of electronic circuits is shown. Each of the circuits has a set of performance parameters "P(I), I=1 . . . L, that must fall within a range bounded by a corresponding set of performance specifications. If one or more of the parameters falls outside of the corresponding specification for the parameter, the circuit fails the test; otherwise, the circuit passes. However, it is an outstanding feature of the present invention that the method and apparatus provide an estimate of the performance parameters as well as indicating whether or not the performance parameters meets their specifications without directly testing them.

The typical context for the method 100 is that there are a number of the electronic circuits "C" obtained from a common manufacturing process for the circuits. The manufacturing process may be characterized by process parameters "Proc(g)", g=1 . . . G, that will vary about mean values of the process parameters over time. The process parameters form a G-dimensional "process parameter space."

In a step 101, the process parameters Proc(g) are perturbed, one at a time, by a small amount, so that, preferably, there is one perturbed value "Pert(g)" for each process parameter. Correspondingly, in a step 102 of the preferred method 100, one circuit "C(g)" is produced under the process conditions represented by each perturbed value Pert(g).

Turning to step 103, traditional ATE testing is conducted on the circuits "C(g)", i.e., C(1), C(2), . . . C(G), and the circuits' performance parameters "$P_g(i)$", i.e., $P_1(i)$, $P_2(i)$, . . . $P_G(I)$, are obtained in Step 106. For example, one of the performance parameters $P_g(i=1)$ may be the slew rate for the circuit C(g), and another performance parameter $P_g(i=2)$ may be the gain of the circuit C(g) at a particular frequency. The performance parameters of the circuits measured or otherwise obtained in the traditional manner are referred to herein as "actual" performance parameters $P_g(i)_A$. In step 107, "g" is iterated in steps 101–106.

In another step 108 of the preferred method, which may be conducted at any time relative to steps 102 to 106, a test stimulus Stim(k) (k=0, 1, . . . k) is selected. Initially, where k=0, the test stimulus is selected arbitrarily in anticipation of later, iterative optimization. Preferably, for simplifying the methodology, the test stimulus is selected to be a piece-wise linear function of time having a relatively small number of breakpoints, such as five to ten breakpoints BP (see FIG. 2).

The stimulus Stim(k) is physically applied to the circuit C(1) (Step 110), and the circuit's response is measured over time (Step 112). Preferably, the circuit's response to the stimulus is sampled at predetermined regular time intervals Δt to provide a set of samples forming a "signature" Sig(g, k, t) for the circuit C(g) corresponding to the stimulus Stim(k) at a predetermined time sample t.

In step 113, "g" is iterated in steps 110 and 112, i.e., these steps are carried out with respect to circuits C(2), C(3), . . . C(G). Accordingly, by the conclusion of step 113 for the initial stimulus Stim(k=0), each of the circuits C(g) has been stimulated with the stimulus Stim(0), corresponding signatures Sig(g,0,t) have been determined, and corresponding actual performance parameters $P_1(i)_A$, $P_2(i)_A$, . . . [[$P_G(Ii_A)$]] $P_G(Ii_A)$ have been measured.

In steps 114a and 114b, the measured signatures and performance parameters for all of the circuits C(g), i.e., $\Sigma_g$ Sig(g, k, t), and $\Sigma_g P_g(i)_A$, are provided to a step 115 wherein a linear predictive model LPM(k) is constructed for the present stimulus Stim(k). The linear predictive model is used for predicting performance parameters, wherein "predict" as used herein is synonymous with "estimate" and is not intended to signify foretelling of future events.

The linear predictive model relates the measured signatures $\Sigma_g$ Sig(g,k,t) to the measured performance parameters $\Sigma_g P_g(i)_A$, by a set of simultaneous, linear equations. For example, for the stimulus Stim(0), the linear model LPM(0) is a matrix of coefficients representing the solution of simultaneous linear equations relating the measured signatures Sig(g, 0, t) to the measured performance parameters $P_g(i)_A$.

Turning to steps 116–118, the LPM(k) is used to receive as an input the signatures Sig(g, k, t) and to produce as an output a prediction or estimate of the performance parameters of the circuit $P_g(i, k)_p$, assuming that the signatures Sig(g,k,t) result from stimulating the circuit C(g) with the stimulus Stim(k). In step 120, the predicted performance parameters are compared with the actual performance parameters obtained from step 114b and an error "e(k)" is obtained (Step 122) that is representative of the prediction error for the set of circuits C(g).

It may be noted that there would be no prediction error in predicting the measured performance parameters $P_g(i,k)_A$ for the circuits C(g) from the signatures actually used to obtain the measured performance parameters if the model perfectly mapped measured signatures to measured performance parameters. However, the linear model assumes linear relationships between the performance parameters and the signatures where these relationships are generally non-linear. Notwithstanding, the error introduced by using a linear model is minimized according to the invention by use of a less costly procedure than would be required for constructing a more accurate, non-linear model.

In practice, each performance parameter will have associated therewith a component of the prediction error, and a total error to be minimized may be defined as the mean squared error summed equally over all of the performance parameters, or the performance parameters may be weighted if desired to emphasize the relative importance of selected parameters. The error may further be defined in other ways as desired without departing from the principles of the invention.

The inventors have recognized that the prediction error "e(k)" depends on the test signal and can be minimized by determining a test signal that is optimum for this purpose. Moreover, by optimizing the test signal to minimize this error, the test signal is made robust in terms of the capability to induce circuits under test, whose performance parameters are subject to further process variations, to produce signatures from which those performance parameters can be predicted.

According to the invention, the prediction error "e(k)" is minimized by iteratively varying the test stimulus Stim(k). Any standard iterative optimization method may be employed for this purpose. The test stimulus Stim(k) is varied by choosing new breakpoints or adding or deleting segments, and repeating steps 103–118 (Step 126) until the error "e(k)" falls within an acceptable maximum ζ. This provides an optimized test stimulus $Stim(k)_{optimized}$ and a linear predictive model $LPM(k)_{optimized}$ that may be used with the optimized test stimulus for use in manufacturing test as discussed below in connection with FIG. 3.

Because the linear predictive models LPM(k) consider only small linearized variations in the process parameters, the error "e(k)" is due to linearization errors introduced by the linear model ($\sigma^2$ (mdl)) and measurement noise variance ($\sigma^2$ (nse)). A preferred objective or cost function for minimizing the total error "e(k)"=($\sigma^2$ (tot)=$\sigma^2$ (mdl)+$\sigma_2$ (nse)) is:

$F = \Sigma k_j$, (for j=1 . . . n), where:

$k_j = 1 + [(1 - (\sigma(tot)/\zeta)]/n$ for $\sigma$ (tot)<ζ, or $k_j = \sigma(tot)\zeta$ for $\sigma$ (tot)≥ζ, where "n" is the number of circuits sampled. The objective function is preferably minimized as a result of using a genetic algorithm for optimizing the piece-wise linear test stimulus.

As is apparent from FIG. 1, revised linear predictive models are preferably constructed for each iteration of the test stimulus. The number of predictive models that are constructed in this iterative process suggests the advantage of using linear models as opposed to non-linear models to optimize the test stimulus. The present inventors have recognized that the test signal optimized using iterative linear models is adequate for testing purposes and the method is significantly less costly than obtaining a non-linear model having greater predictive accuracy, especially where the non-linear model employs an iteratively optimized test stimulus.

Figure 3:
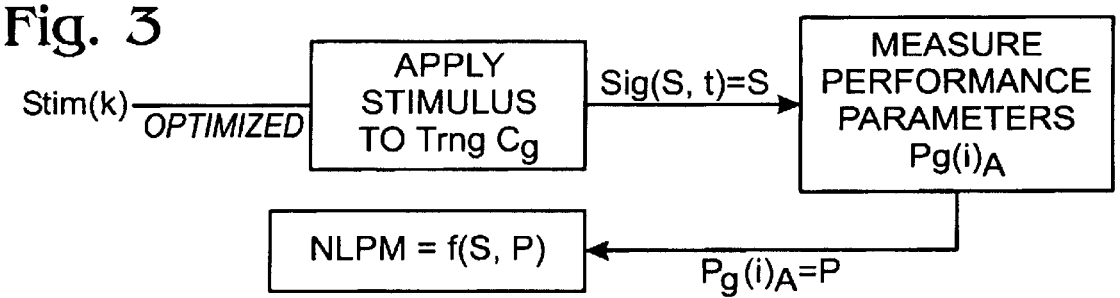
FIG. 3 is a flow chart illustrating construction of a non-linear model according to the present invention.

All of the aforementioned steps are taken in advance of actual manufacturing testing, where an investment in time may be made without impacting the manufacturing process. For actual manufacturing test, a non-linear predictive model "NLPM" is preferably constructed for use with the optimized test signal $Stim(k)_{optimized}$ found by use of the iteratively determined linear predictive models of steps. A preferred method for constructing the NLPM is provided by J. H. Friedman, "Multivariate Adaptive Regression Splines," *The Annals of Statistics*, Vol. 19, No. 11–141, incorporated by reference herein in its entirety. However, other known mathematical methods may be employed for constructing the NLPM as desired without departing from the principles of the invention. Referring to FIG. 3, similar to the LPM, the NLPM is constructed to relate measured signature outputs Sig(g,t) from several manufactured "training" circuits ("trng $C_g$"), as opposed to simulation models. The training circuits are stimulated with $Stim(k)_{optimized}$, and measured performance parameters $P_g(i)_A$ for the training circuits are obtained.

Figure 4:
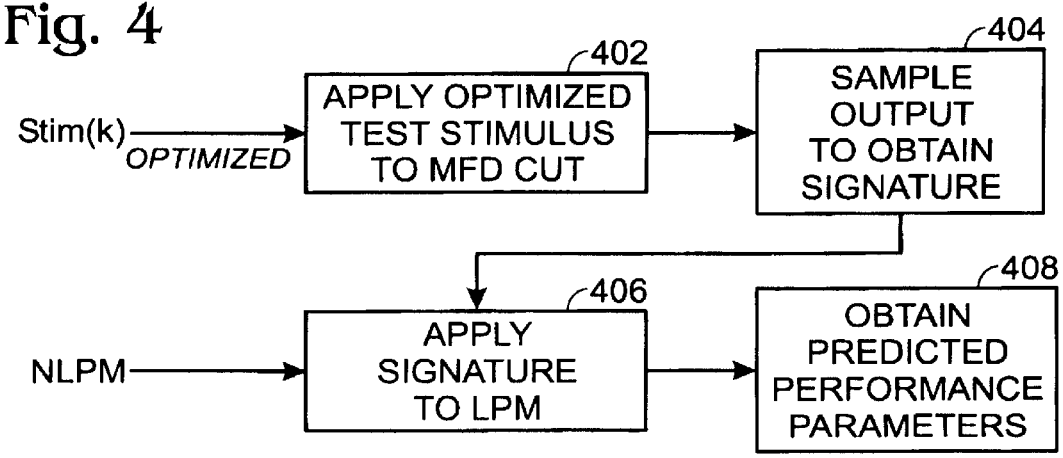
FIG. 4 is a flow chart of a preferred method for manufacturing testing according to the present invention using the optimized test stimulus of FIG. 1.

Turning to FIG. 4 wherein a manufacturing test process 400 is illustrated, once the optimized test stimulus and NLPM are found and determined, they may be employed in a manufacturing test strategy by applying the optimized test stimulus $Stim(k)_{optimized}$ to any number of manufactured circuits under test ("mfd.CUT") (Step 402), sampling the outputs of the circuits to obtain signatures therefor (Step 404), applying the signatures to the NLPM (Step 406), and obtaining predicted performance parameters for each of the circuits (Step 408) at the output of the NLPM. In this way, a significant time saving is realized for each test, since a single test stimulus produces an accurate prediction of performance parameters for the circuits.

The manufacturing process used to produce the electronic circuits will shift or drift over time as well as fluctuate differently (either more or less) than at the time of carrying out the construction of the non-linear model NLPM. In other words, the NLPM may not characterize the process adequately as the process changes over time. To detect and correct for this circumstance, a method 500 shown in FIG. 5 according to the present invention is preferably used to "autocalibrate" the NLPM. In a preferred form of the method, the signature responses for each manufactured circuit under test (step 502) are obtained from step 404 (FIG. 4) and statistically analyzed (step 504). For example, the mean, maximum and minimum value of the signatures for the manufactured devices may be noted. These statistical parameters may be compared to the same kind of parametric data recorded for the training circuits to determine a deviation (step 506). This may be done for each manufactured circuit individually or, preferably, the information obtained from a number of the manufactured circuits may be pooled, the number being chosen to provide a statistically significant inference that the deviation reflects a significant process change. Such a circuit or set of circuits provides one or more "outlier circuits."

Where the deviation in one or more of the parameters for such outlier circuits is determined to have reached a predetermined threshold level (step 508), the NLPM is preferably updated to reflect the additional information provided by the outlier circuits. More particularly, the signature outputs of the outlier circuits are obtained and performance parameters for the outlier circuits are measured (Step 509). An "updated" NLPM is constructed (Step 510) using the outlier circuits as additional data points. More particularly, where the original or previous NLPM is constructed based on a set of training circuits g=G1, the updated NLPM may be similarly constructed based on the set of training circuits g=G1+the number of outlier circuits, where the outlier circuits are reflective of the changed process. Alternatively, an entirely new NLPM could be constructed by obtaining additional "new" or "updated" training circuits.

Figure 6:
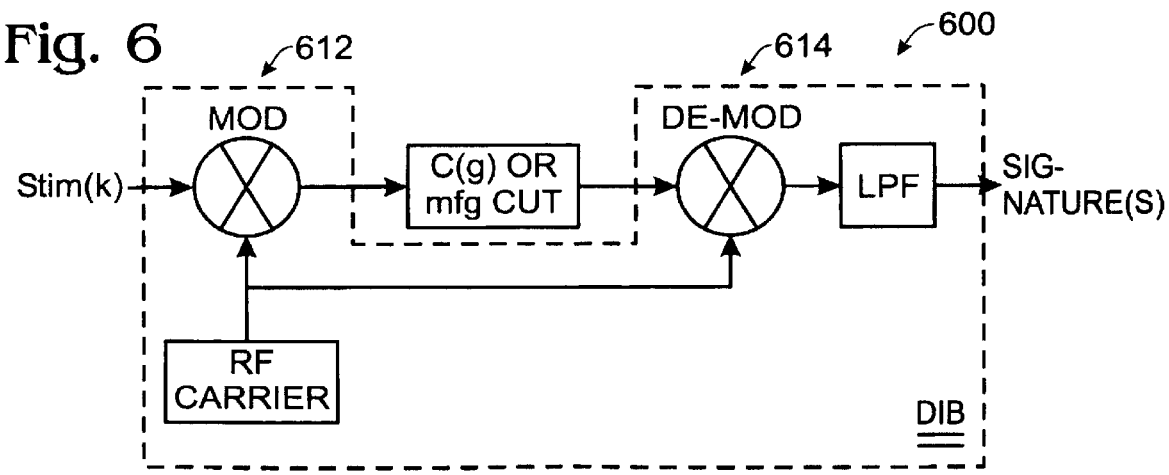
FIG. 6 is a block diagram illustrating a preferred method for low cost signature testing of RF electric circuits according to the present invention.

Turning to FIG. 6, a method 600 that is particularly adapted for testing RF circuits according to the invention is illustrated. In the method 600, step 110 of the method 100 (see FIG. 1) is modified by modulating an RF carrier with the stimulus Stim(k). The modulated RF carrier is applied to the circuit C(g), and its response is measured over time as in step 112. Additional steps 612 and 614 are provided wherein the response is demodulated by the RF carrier and low-pass filtered. A device interface board DIB is provided for modulating the carrier with the test stimuli, demodulating the signature outputs of the circuits under test, and passing the demodulated outputs through a low pass filter LPF.

The modulation/demodulation scheme employed in the method 600 is arbitrary, it being understood that any modulation/demodulation scheme may be employed without departing from the principles of the invention.

Steps according to the present invention that apply an input to one of the models, or obtain an output of the models, may be accomplished in a computer at the instruction of a computer program, which may be embodied in any machine-readable form, such as encoded in volatile or non-volatile semiconductor memory or floppy disk. The models themselves are preferably computerized models, meaning for purposes herein that the models are accessible for use by a computer. Where actual electrical stimuli are applied to actual circuits, or where actual outputs from the actual circuits are obtained, any testing equipment or device known in the art for carrying out these actions may be employed.

It is to be recognized that, while a particular low cost signature test for RF and analog circuits has been shown and described as preferred, other configurations and methods could be utilized, in addition to those already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

APPENDIX A

Low-Cost Signature Testing of RF Circuits

*Ram Voorakaranam* and *Abhijit Chatterjee*
Ardext Technologies Inc., Atlanta, GA

Abstract: *Production test costs for today's RF circuits are rapidly escalating. Two factors are primarily responsible for this cost escalation: (a) The high cost of RF ATE and (b) Long test times demanded by elaborate performance tests. In this paper, we propose a low-cost test approach for the test of RF circuits using modulation of a low frequency test signal and subsequent demodulation of the DUT response. The demodulated response of the DUT is used as a signature from which all the performance specifications are predicted. We believe the proposed low-cost solution can be easily built into a load board that can be interfaced to an inexpensive tester.*

1.0 Introduction

With the explosion in the wireless industry, RF integrated circuits are being used increasingly in a wide range of applications. Manufacturers of wireless applications are integrating RF, analog and digital blocks on the same silicon die for better performance and low cost. Production testing of high performance RF circuits is a major component of total RF electronics manufacturing cost because of elaborate tests and expensive testers. New RF test solutions are needed to keep pace with the phenomenal growth in the wireless industry, and the ever increasing consumer demand for products with higher functionality at low price.

*Signature testing* has been proposed as a low cost alternative to specification testing of analog circuits [1,2]. It has been shown that without explicitly testing for the circuit specifications, analog performance can be predicted by using the transient response of the DUT as a signature (hence the name *signature test*). This technique coupled with a systematic test optimization procedure enables robust testing while reducing test costs dramatically.

The use of modulated signals for the test of RF circuits has been well studied in the past [3]. Recently, a new technique called Modulated vector network analysis (MVNA) [4] has been proposed for making classic RF measurements on wideband modulated signals. Using modulated signals, the technique is capable of measuring S-parameters and performing signal analysis using a single data acquisition. Further, this technique allows the behavior of the wideband components to be tested close to their real-world operation.

In this paper, we propose a new signature testing approach [5] for testing RF circuits using test signal modulation and test response demodulation. The proposed approach involves the following steps:

1. The ATE supplies carefully designed baseband test stimulus to the loadboard.

2. On the load board, the test stimulus is modulated onto a carrier. This modulated carrier is the test input signal to the DUT.

3. DUT response is demodulated and baseband signal is sent back to the ATE.

4. The design of the test stimulus (baseband+carrier) is done in such a way that performance variations in DUT cause significant changes in the response seen by the ATE.

The emphasis of the proposed approach is to provide a highly cost-effective solution for production testing of RF circuits. The attractive features of our solution are (a) The modulator and demodulator can be easily built into the DUT loadboard and (b) The test signal applied to the loadboard and the signature response to be measured are both baseband, facilitating the use of a low cost ATE.

The rest of the paper is organized as follows. Section 2 describes the proposed approach for RF signature test and a procedure for test signal optimization. Section 3 discusses application of the proposed approach to the testing of a low noise amplifier (LNA) circuit. Section 4 concludes the paper.

2.0 Proposed Approach

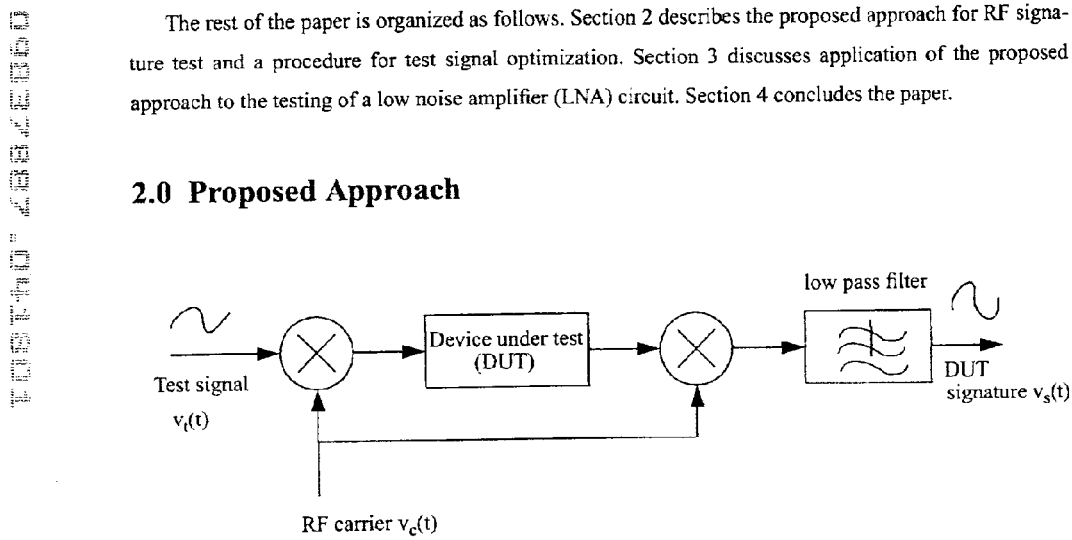

FIGURE 1. Signature testing of RF circuits

The proposed signature test approach is illustrated in Figure 1. A baseband test signal $v_t$ is modulated on a high frequency carrier and is applied to the DUT. Output of the DUT is demodulated and filtered so that the resulting signature only has baseband variations. As the applied test signal $v_t(t)$ and the demodulated test response $v_d(t)$ are both baseband, the proposed test approach obviates the need for an expensive RF tester.

Further the modulator and demodulator can easily be designed into the loadboard, leading to an inexpensive test solution.

Figure 2:
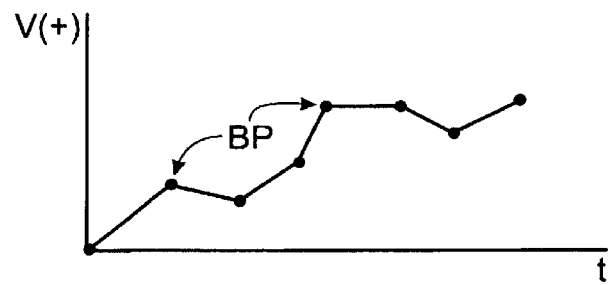
FIG. 2 is a preferred form of a test stimulus according to the present invention.

A regression model built between the DUT signature and the DUT measurements allows the prediction of DUT measurements without explicitly testing for them [1]. The process is illustrated in Figure 2. Several different DUT samples from the IC manufacturing process are considered and the DUT measurements are obtained using a high performance ATE. For each of these samples, an optimized baseband test signal is applied and the test signature is obtained by digitizing samples of the demodulated DUT response.

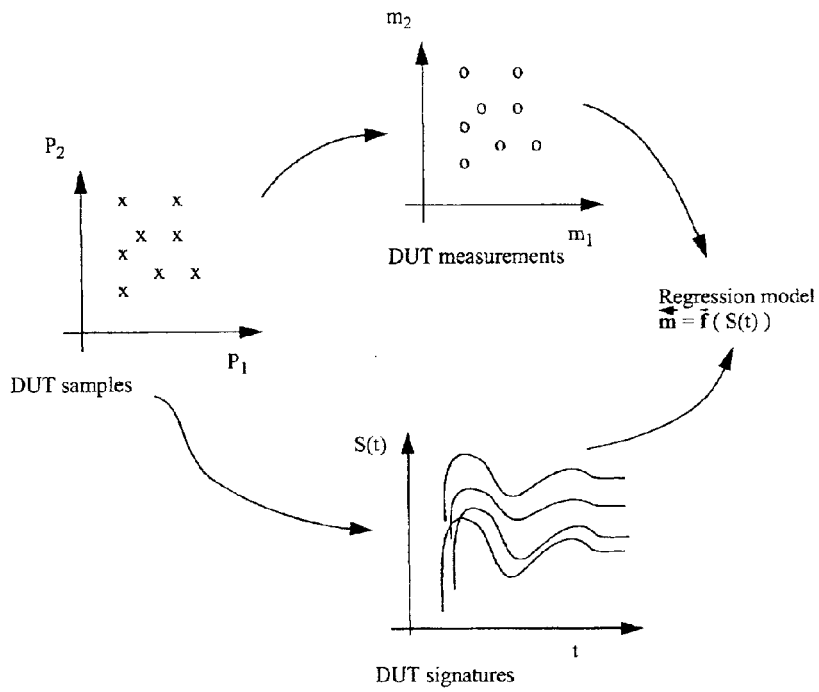

FIGURE 2. Relationship between DUT measurements and signature

The test signal applied to the DUT has to be chosen so as to minimize the error in predicting DUT measurements from the signature response. For this purpose, we use the optimization procedure described in [2]. More specifically, the prediction error for $ith$ measurement, for a small perturbation in process parameters is given by $$\sigma^2_{e(i)} = \sigma^2_{p(i)} + \sigma^2_{n(i)}$$

where $\sigma_p$ is the least squared error between actual and predicted specifications for a small perturbation in (manufacturing) process parameters, and $\sigma_n$ is the error contributed by measurement noise [2]. The objective function to be minimized is obtained as $$F = \sum_{j=1,\ldots,n} k_j \quad \text{where} \quad k_j = 1 + \frac{\left(1 - \frac{\sigma_{e(i)}}{\sigma^*}\right)}{n} \quad \text{for } \sigma_{ei} < \sigma^*$$

$$= \frac{\sigma_{e(i)}}{\sigma^*} \quad \text{for } \sigma_{ei} \geq \sigma^*$$

$\sigma^*$ being the maximum allowed prediction error, and $n$ the number of DUT measurements.

The resulting objective function is minimized using *genetic optimization* [6], where successive generations of a piecewise linear test stimulus (encoded as a genetic string) yield decreasing values of the objective function.

3.0 Experimental results

This section presents simulation results for a RF amplifier to illustrate the proposed approach. The application circuit is a 900 MHz low-noise amplifier (LNA) [7]. Figure 3 shows the schematic for the LNA. For illustration, three measurements were considered: Conversion gain, Noise Figure, and Third-order intercept point. Conversion gain and noise figure performances were measured at 900 MHz while the third-order intercept was measured by applying two input frequencies at 900 MHz and 920 MHz and observing the third-order harmonics at 880 MHz and 940MHz. The LNA circuit was simulated using the SpectreRF simulator [7]. SpectreRF analyses support efficient calculation of operating point, transfer function, noise and distortion of common RF and communication circuits. The DUT measurements were extracted using the Cadence Open Command Environment for Analysis (OCEAN) [8].

The objective of our test approach is to replace conventional DUT measurements (requiring an expensive RF ATE) with a signature test that can be applied using a low-cost ATE for production test of the DUT. The proposed signature test has to be effective throughout the range of variation expected in the manufacturing process of the DUT. For the circuit in Figure 3, the important process variations comprise of variation in the values of the resistors, capacitors and the BJT model parameters. For BJTs, the following model parameters were considered: saturation current ($I_s$), Forward current gain ($\beta_f$), Forward early voltage ($V_{af}$), base resistance ($r_b$), current corner for beta ($i_{kf}$). Other BJT parameters were found to have negligible impact on the behavior of the LNA circuit. We further assume the parameter variations to be uniformly distributed around their nominal values.

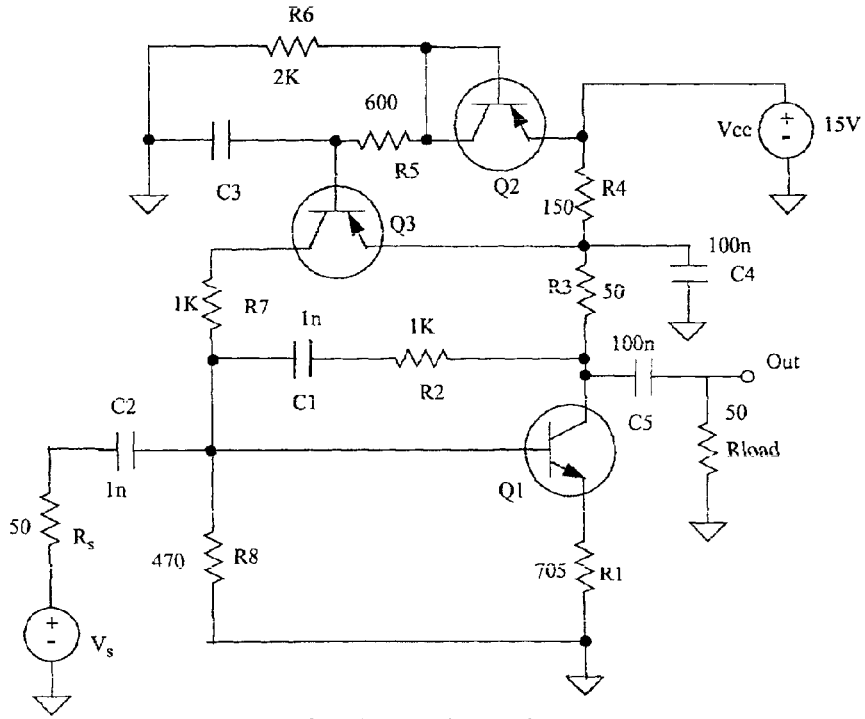

FIGURE 3. 900 MHz Low-noise amplifier

Following the ATPG approach described in Section 2, a linear prediction model is built to predict the LNA specifications from its signature response, obtained from Figure 1. For modulation and demodulation, a 10dBm, 900 MHz RF carrier is chosen. The demodulated DUT response is then passed through a low pass filter with a cutoff frequency of 10MHz. The DUT signature is obtained by sampling the filtered response at the nyquist rate (20MHz).

Figure 5:
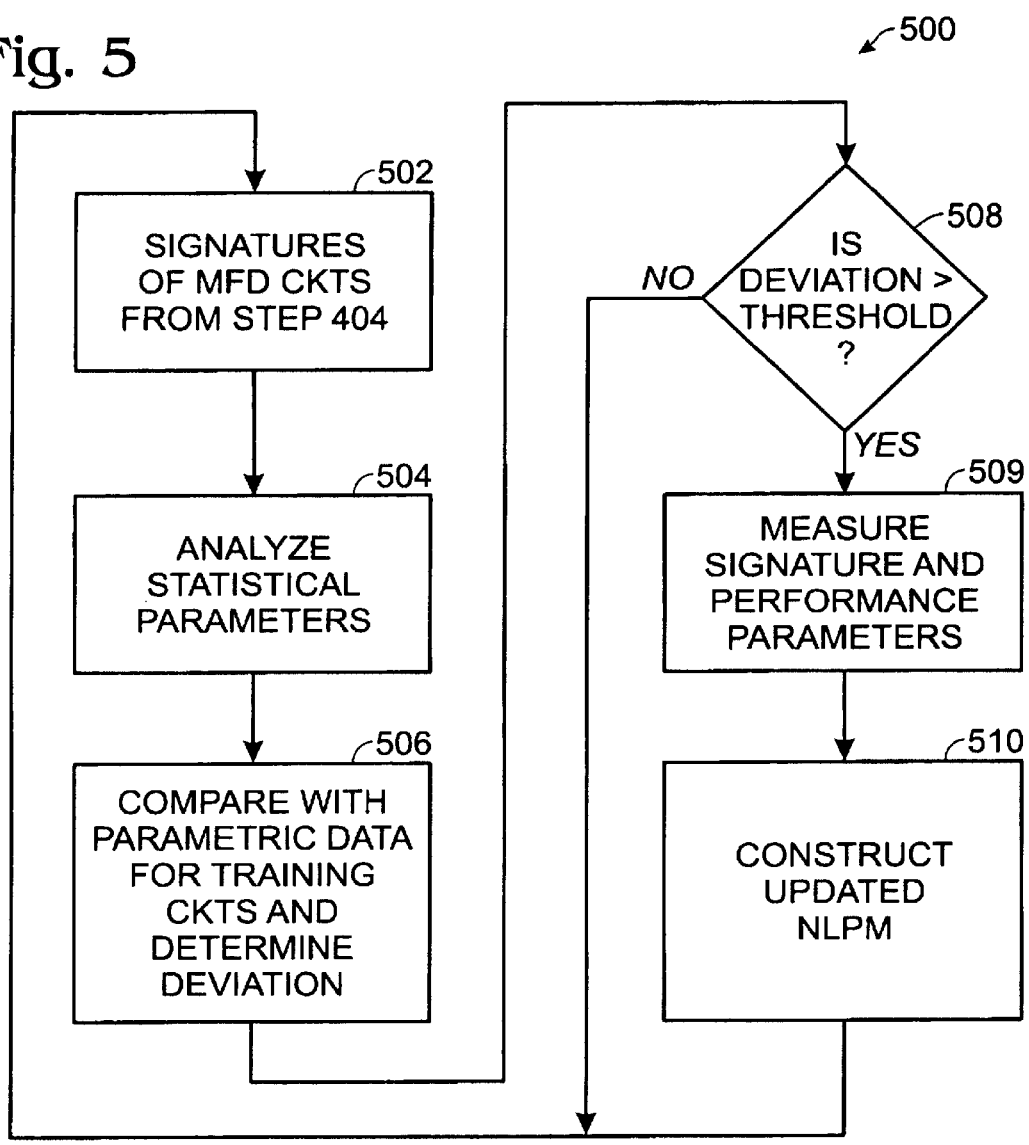
FIG. 5 is a flow chart for an autocalibration method according to the present invention.

A genetic optimization algorithm is then used to synthesize a piecewise linear test stimulus for minimizing the least squared error between the actual and predicted specifications for a small perturbation in the process parameters. Further, to keep the simulation time short, the test signal is constrained to be of 5us duration. Figure 4 shows an optimized test stimulus after running 10 iterations of the genetic algorithm. Figure 5 shows the signature of 100 sample circuits in response to the applied test stimulus.

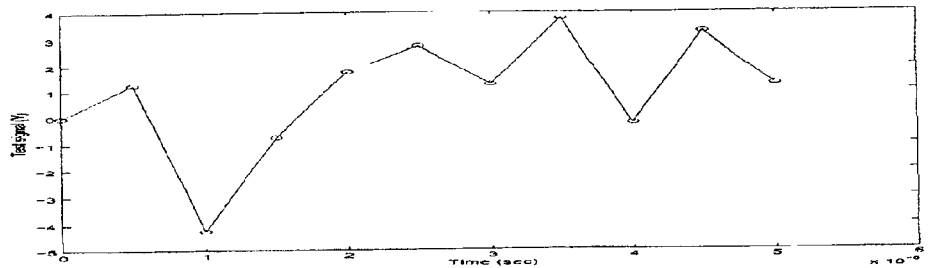

FIGURE 4. Optimized test stimulus

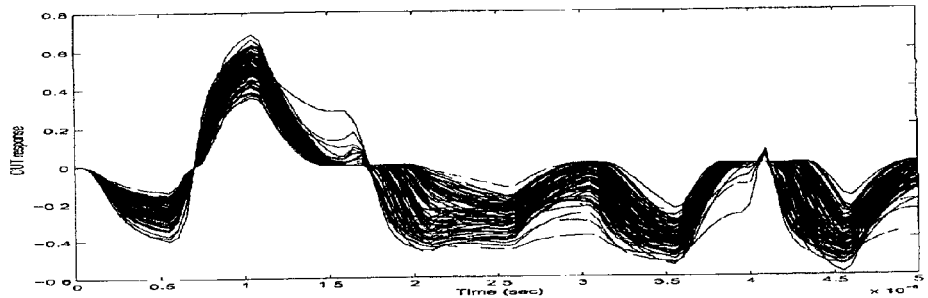

FIGURE 5. Signature response for 100 different circuit instances

To validate the proposed signature test, we considered several circuit instances obtained by sampling the uniformly distributed process parameters. For correlation, a multivariate regression model was built between the DUT measurements (conversion gain, noise figure and IP3) and the signature responses for 200 circuit instances. Thereafter, DUT measurements for 100 more circuit instances were predicted from their signatures using the correlation model. Figure 6 shows the prediction results assuming a $\pm$ 25% uniform distribution for the process parameters. Measured values of conversion gain, noise figure and IP3 for the 100 circuit instances obtained by direct simulation are shown by a 'o' and those predicted by signature test are denoted by a '*'. The plots show an excellent agreement between direct measurements and those predicted using signature test. The attractive feature of our technique is that these results were obtained using an extremely short duration (5us) test signal, promising significant savings in test costs.

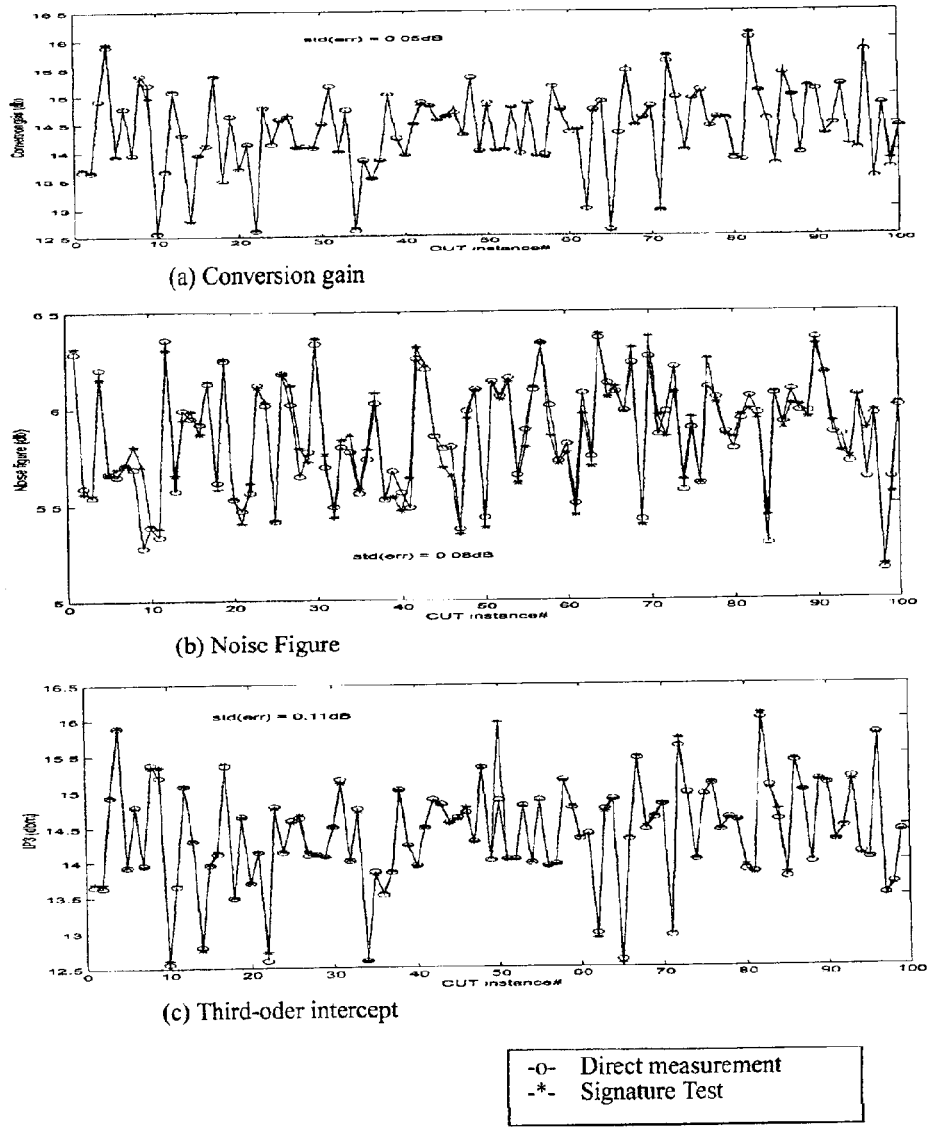
FIGURE 6. Predicted and Actual DUT measurements with +/- 25% component variations
Figure 7 shows similar plots for a wider (± 50%) process distribution. In reality, most modern IC manufacturing processes are more tightly controlled. The results suggest that even for IC fabs with wide process spreads, the proposed signature test technique holds considerable promise.

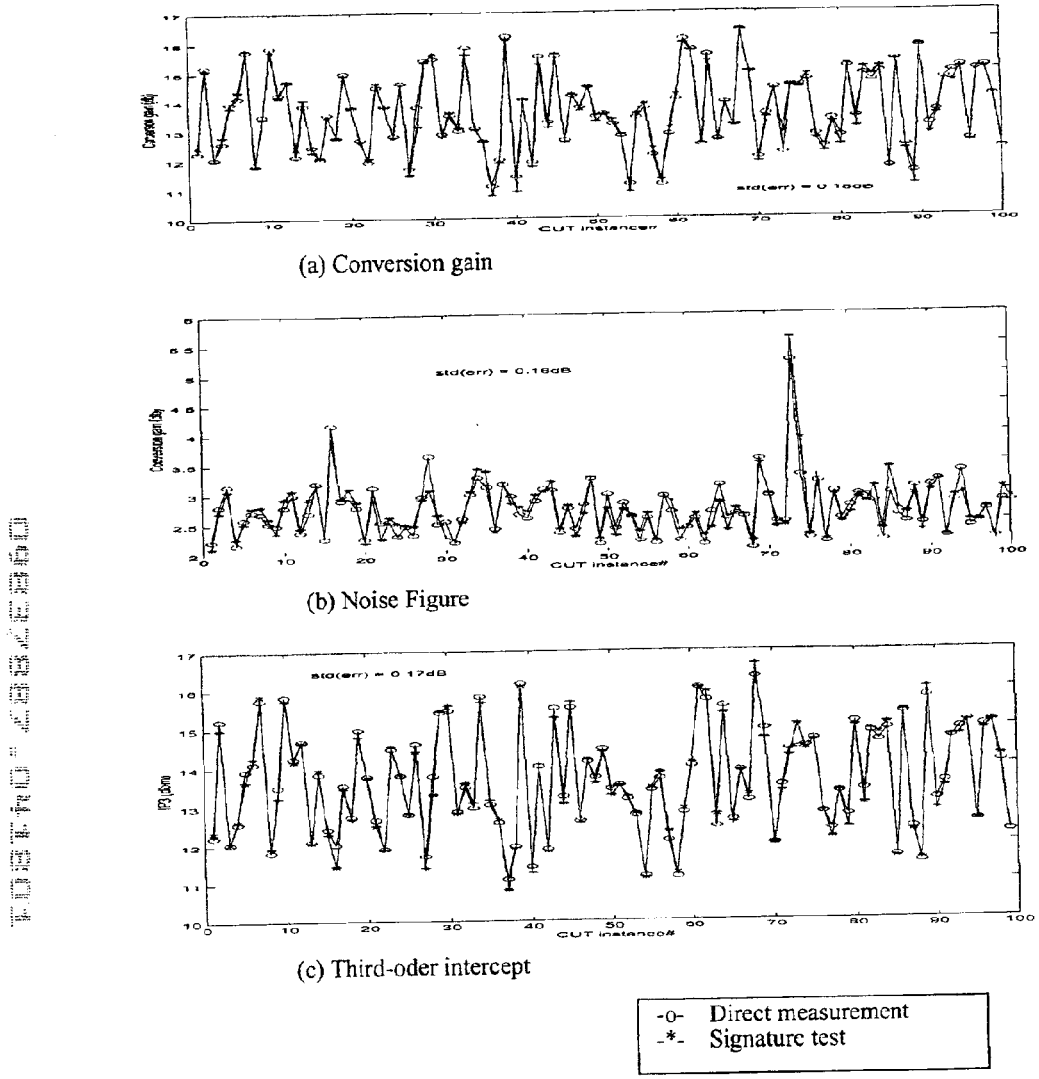

(a) Conversion gain (b) Noise Figure (c) Third-oder intercept

-o- Direct measurement
-*- Signature test

FIGURE 7. Predicted and Actual DUT measurements with +/- 50% component variations Figure 8 depicts the impact of noise when measuring signature response. The plots show signature test results for noise figure measurements when additive gaussian noise is added to the signature response of the DUT. It can be seen from the results that there is a close agreement between the actual and predicted values of noise figure even with a large (5mv RMS) measurement noise. The experiment suggests that robust signature test performance is possible in the presence of measurement noise.

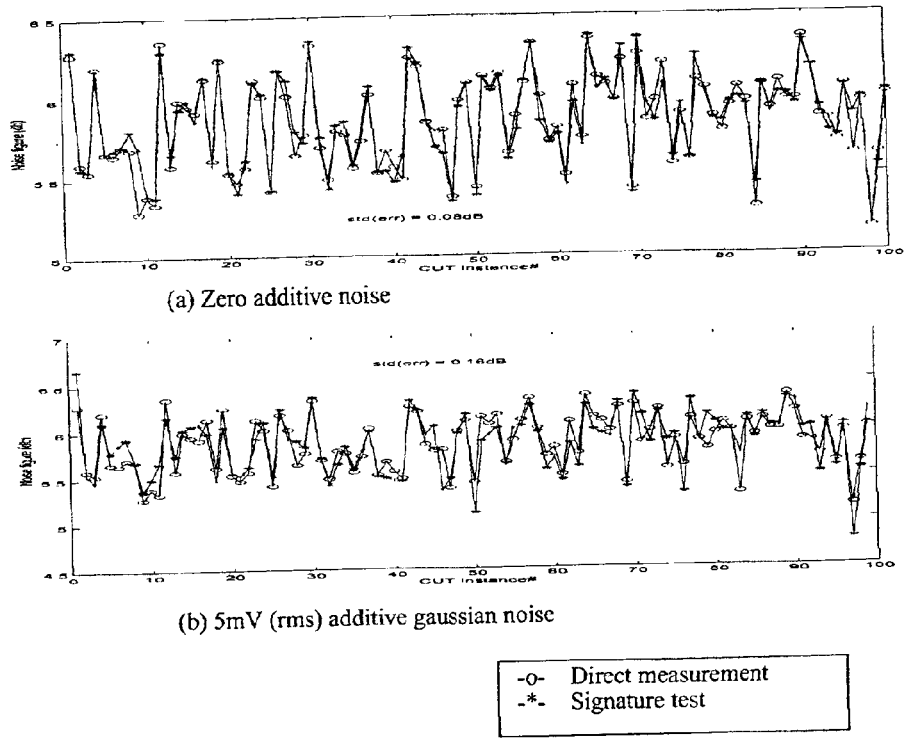

(a) Zero additive noise (b) 5mV (rms) additive gaussian noise

| -o- | Direct measurement |
| -*- | Signature test |

FIGURE 8. Effect of additive noise on signature test results

3.1 Hardware Validation

For hardware validation of the proposed approach, we built a RF frontend module using a RF2401 monolithic integrated receiver front-end IC from RF MicroDevices. The mixer and lowpass filter modules for generating signature test were obtained from Mini-Circuits. Figure 9a. shows a picture of the signature test prototype. The DUT signature obtained in response to a sinewave test (500 mV p-p, 2MHz) is shown in Figure 9b. We are currently making measurements on several frontend IC samples from RF MicroDevices. We hope to include data from these experiments in the final version of the paper.

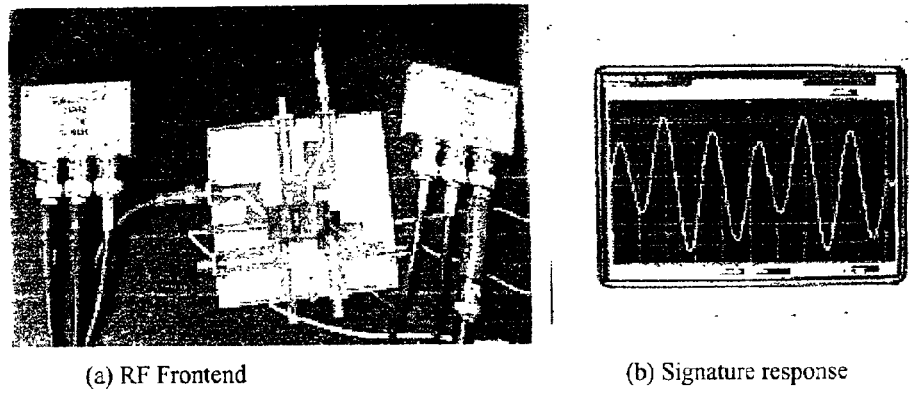

(a) RF Frontend  (b) Signature response

FIGURE 9. RF signature test hardware prototype

4.0 Conclusions

In this paper, we proposed a low-cost technique for the signature testing of RF circuits. The proposed solution can be easily built into a load board that can be interfaced to an inexpensive tester. As the DUT measurements are obtained on a low-cost ATE using an extremely short duration test stimulus, significant savings in production test costs of RF circuits is made possible.

5.0 References

[1] P. N. Variyam and A. Chatterjee, "Specification-driven Test Design for Analog Circuits," *International Symposium on Defect and Fault Tolerance in VLSI Systems*, 1999, pp. 335-340, 1998.

[2] R. Voorakaranam, A. Chatterjee, "Test Generation for Accurate Prediction of Analog Specifications", *IEEE VLSI Test Symposium*, pp. 137-142, 2000.

[3] M.S. Huetmaker, "RF/Analog Test of Circuits and Systems," IEEE VLSI Test Symp 2000 IEEE Los Alamitos CA USA p 179.

[4] T. Wilson, "Test Challenges for Next-generation RF Devices," EE Evaluation Engineering Vol. 39, No. 11, 2000, pp. 31-37.

[5] *US Provisional Patent Application 2292PR*, "Test Generation for High Frequency and RF Circuits", April, 2000.

[6] D.E. Goldberg, *Genetic Algorithms in Search, Optimization and Machine Learning*, Addison Wesley, 1989.

[7] Cadence *SpectreRF* Simulator User Guide.

[8] Cadence *OCEAN* Reference Guide.

[9] http://www.rfmd.com/DataBooks/db97/2401.pdf

What is claimed is:

1. A method for testing of electronic circuits produced by a manufacturing process subject to process variations and characterized by a selected set of performance parameters, comprising the steps of:
   constructing a model for predicting said performance parameters for a first electronic circuit produced by the manufacturing process as a result of receiving the output of one or more second electronic circuits produced by the manufacturing process and stimulated with a selected test stimulus;
   providing said output to said model;
   obtaining a prediction of said performance parameters by use of said model;
   measuring said performance parameters independently of said model; and
   iteratively varying said test stimulus to minimize the error between said prediction and the corresponding measured values for said performance parameters, for determining an optimized test stimulus.

2. The method of claim 1, further comprising constructing said model as a linear model.

3. The method of claim 2, further comprising revising said model for at least some of said iterations of said test stimulus.

4. The method of claim 1, further comprising constructing said model as a non-linear model, including applying the optimized said test stimulus to one or more manufactured training circuits, obtaining respective signature outputs of said training circuits, measuring said performance parameters for said training circuits and relating said signature outputs of said training circuits to the measured said performance parameters for said training circuits.

5. The method of claim 4, further comprising applying the optimized said test stimulus to said first electronic circuit, obtaining a signature output thereof, applying said signature output of said first electronic circuit to said non-linear model, and obtaining a prediction of said performance parameters of said first electronic circuit by use of said model.

6. The method of claim 5, further comprising characterizing said signature outputs of said training circuits, characterizing said signature output of said first electronic circuit, comparing the results of said steps of characterizing with each other to determine a deviation therebetween, comparing said deviation to a predetermined threshold and, if said deviation is greater than said threshold, updating said model, including relating said signature outputs of said training circuits and said signature output of said first electronic circuit to the measured said performance parameters for said training circuits and said first electronic circuit.

7. The method of claim 5, wherein said step of applying includes modulating an RF carrier with the optimized said test stimulus, and wherein said step of obtaining includes demodulating the output of said first electronic circuit by said RF carrier to obtain said signature output thereof.

8. The method of claim 4, further comprising providing performance specifications for said first electronic circuit, applying the optimized said test stimulus to said first electronic circuit, obtaining a signature output thereof, applying said signature output of said first electronic circuit to said model, and comparing said signature output of said first electroni circuit with said performance specifications for determining whether said first electronic circuit fails to meet said performance specifications.

9. An apparatus for testing of electronic circuits produced by a manufactoring process subject to process variations and characterized by a selected set of performance parameters, comprising:
   a computerized model for predicting said performance parameters for a first electronic circuit produced by the manufacturing process as a result of receiving the output of one or more second electronic circuits produced by the manufacturing process and stimulated with a selected test stimulus;
   a device for iteratively varying said test stimulus; and
   a computer program embodied in a machine readeble form and adapted to command said device to iteratively vary said test stimulus so as to minimize the error between the performance parameters as predicted by said model and corresponding measured values for said performance parameters, for determining an optimized test stimulus.

10. The apparatus of claim 9, wherein said model is a linear model.

11. The apparatus of claim 10, wherein said computer program is further adapted for revising said model for at least some of said iterations of said test stimulus.

12. The apparatus of claim 9, wherein said model is a non-linear model obtained by applying said optimized said test stimulus to one or more training circuits produced by the manufacturing process, obtaining respective signature outputs of said training circuits, measuring said performance parameters for said training circuits and relating said signature outputs of said training circuits to the measured said performance parameters for said training circuits.

13. The apparatus of claim 12, wherein said device is further adapted to apply said optimized said test stimulus to said first electronic circuit and obtain a signature output thereof, wherein said computer program is adapted to receive said signature output, of said first electronic circuit, apply the received said signature output to said model, and obtain a prediction of said performance parameters of said first electronic circuit by use of said model.

14. The apparatus of claim 13, wherein said computer program is further adapted for characterizing said signature outputs of said training circuits, characterizing said signature output of said first electronic circuit, comparing the results of said steps of characterizing with each other to determine a deviation therebetween, comparing said deviation to a predetermined threshold and, if said deviation is greater than said threshold, update said model by steps including relating said signature outputs of said training circuits and said signature output of said first electronic circuit to the measured said performance parameters for said training circuits and said first electronic circuit.

15. The apparatus of claim 13, wherein said device is adapted for modulating an RF carrier with the optimized test stimulus and demodulating a direct output of said first electronic circuit by said RF carrier to obtain said signature output of said first electronic circuit.

16. The apparatus of claim 15, wherein said device includes a low-pass filter for low-pass filtering said direct output of said first electronic circuit to obtain said signature output of said first electronic circuit.

17. The apparatus of claim 12, wherein said device is further adapted to apply said optimized test stimulus to said first electronic circuit and obtain a signature output thereof, wherein said computer program is adapted to receive said signature output of said first electronic circuit, apply said signature output of said first electronic circuit to said model, and compare said signature output of said first electronic circuit with performance specifications for said first electronic circuit, for determining whether said first electronic circuit fails to meet said performance specifications.

* * * * *